United States Patent
Jakob et al.

(12) 
(10) Patent No.: US 6,364,144 B1
(45) Date of Patent: *Apr. 2, 2002

(54) ELECTRIC ACTUATOR CASING COMPRISING FALL SENSITIVE ELEMENTS, ESPECIALLY ONE OR MORE SENSORS INTENDED FOR TRIGGERING PROTECTIVE DEVICE INSIDE VEHICLES

(75) Inventors: Gert Jakob, Stuttgart; Erwin Liegl, Eberdingen, both of (DE); Heiko Buss, El Paso, TX (US)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/180,815
(22) PCT Filed: Jul. 25, 1997
(86) PCT No.: PCT/DE97/01571
§ 371 Date: May 31, 2000
§ 102(e) Date: May 31, 2000
(87) PCT Pub. No.: WO98/09488
PCT Pub. Date: Mar. 5, 1998

(30) Foreign Application Priority Data

Aug. 29, 1996 (DE) .......................................... 196 34 961

(51) Int. Cl.$^7$ ................................................. B65D 6/28
(52) U.S. Cl. ...................................... 220/4.02; 116/203
(58) Field of Search ................................. 320/3.2–3.94, 320/402; 439/76.1; 73/11.01, 12.01; 116/203

(56) References Cited

U.S. PATENT DOCUMENTS

| | | | |
|---|---|---|---|
| 3,373,716 A | * | 3/1968 | Williams .................... 73/12.01 |
| 4,197,959 A | * | 4/1980 | Kramer .................... 220/3.8 X |
| 4,911,296 A | * | 3/1990 | Hart, Jr. .................... 206/373 |
| 4,993,803 A | * | 2/1991 | Suverison et al. ............ 385/88 |
| 5,024,359 A | * | 6/1991 | Thomas ........................ 224/36 |
| 5,050,526 A | * | 9/1991 | Nelson et al. .............. 114/364 |
| 5,382,169 A | * | 1/1995 | Bailey et al. .............. 439/76.2 |
| 5,429,508 A | * | 7/1995 | Brevick ....................... 439/15 |
| 5,551,279 A | * | 9/1996 | Quick ........................ 73/12.01 |
| 5,577,937 A | * | 11/1996 | Itoh et al. .................... 439/620 |
| 5,621,189 A | * | 4/1997 | Dodds .................... 220/3.8 X |
| 5,651,690 A | * | 7/1997 | Klas et al. .................... 439/352 |
| 5,679,924 A | * | 10/1997 | Young et al. ............. 220/3.4 X |
| 5,769,598 A | * | 6/1998 | MacNeil ..................... 414/786 |
| 5,814,765 A | * | 9/1998 | Bauer et al. ........... 220/4.02 X |

FOREIGN PATENT DOCUMENTS

| | | |
|---|---|---|
| DE | 24 35 140 | 7/1976 |
| DE | 42 43 180 A1 | 8/1993 |
| DE | 42 42 943 A1 | 6/1994 |
| WO | WO 93/05399 | 3/1993 |
| WO | WO 95/14366 | 5/1995 |

* cited by examiner

Primary Examiner—Allan N. Shoap
Assistant Examiner—Joseph C. Merek
(74) Attorney, Agent, or Firm—Michael J. Striker

(57) ABSTRACT

Short extensions (15) are formed on the housing (10) of a control device. These extensions (15) consist of the same material as the housing (10) and can therefore be produced in a simple and cost-effective manner in a single production process. The impact energy being created when the housing (10) is dropped on the ground can be compensated with the aid of these extensions (15). In special cases and as a function of the specifications, visually noticeable damage of the extensions (15) can be used as an indicator for possible damage to the electric components arranged in the housing (10).

5 Claims, 1 Drawing Sheet

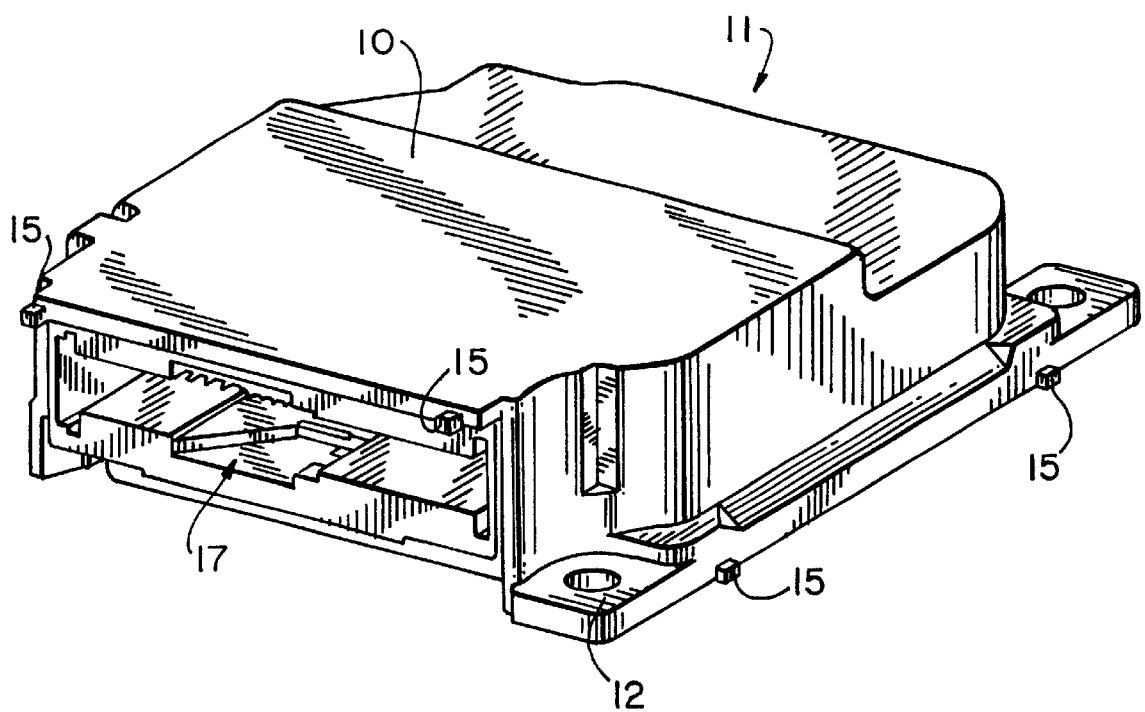

ELECTRIC ACTUATOR CASING COMPRISING FALL SENSITIVE ELEMENTS, ESPECIALLY ONE OR MORE SENSORS INTENDED FOR TRIGGERING PROTECTIVE DEVICE INSIDE VEHICLES

BACKGROUND OF THE INVENTION

An electrical device is known from the reference WO 93/05399, which is enclosed in an elastic material in the form of a protective sheath. This elastic material is intended to absorb the energy caused by blows or droppings of the device, for example on the ground. By means of this, it is intended to prevent the breakage or damage of the electrical device, or to respectively its components. Additional elements of an elastic material are required which, although they compensate the gravitational energy, do not make a drop recognizable at a later time. These elements result in a very bulky structure of these devices.

SUMMARY OF THE INVENTION

In accordance with the present invention, the housing for an electrical control device with drop-sensitive components, in particular sensors for triggering protective devices in motor vehicles, has at least one extension formed on it, and the housing and the extension are made of the same, at least plastically deformable material. The housing in accordance with the invention and having these characteristics has the advantage that the sensor can be protected from damage, for example by being dropped prior to installation, with extremely small or no additional costs and production outlay. The energy acting on the sensor, or respectively the housing, when it is being dropped can be compensated in a simple manner by the extensions, which are made of the same material as the actual housing. Since the extension are made of the same material as the housing, the housing and the extensions can be produced in a single production step. Since with conventional sensors the housing mostly consists of a brittle material, in particular of pressure-cast metal, and this use is permissible, production is particularly simple. The plastic deformation or the breaking of the pins, or respectively of the extensions, can also be used as an indicator showing that the sensor has already been dropped once and in the process has exceeded a defined provided energy threshold. When using pressure-cast aluminum for the housing, the extensions can be applied during the casting process almost without additional cost.

Advantageous further developments of the housing disclosed in claim 1 are possible by means of the steps recited in the dependent claims.

BRIEF DESCRIPTION OF THE DRAWINGS

An exemplary embodiment of the invention is represented in the drawings and will be explained in greater detail in what follows. The single drawing FIGURE represents a perspective view of a housing.

DESCRIPTION OF THE PREFERRED EMBODIMENT

In FIG. 1, the housing of a sensor 11 for triggering protective devices, for example a belt tightener, airbag, warning blinker devices or roll bars in motor vehicles, is identified by 10. However, other drop-sensitive sensors, such as ABS (anti-lock braking system) and ASR (traction control), can also be used. Any sensor operating in accordance with different measuring principles and commercially available can be used as the sensor. In place of a sensor, the housing 10 can also contain a control device with electronic components for controlling an anti-lock braking system or a traction control. Several flange-like brackets 12 are arranged on the housing, by means of which the housing can be fastened, for example in a motor vehicle. Furthermore, several extensions 15 are formed at several locations of the housing, they are located in particular on the side, or respectively the sides, where the highest accelerations during dropping occur. These extensions consist of the same material as the housing 10 itself, i.e. for example of pressure-cast aluminum. Furthermore, brittle materials, which cause a plastic deformation of the extensions 15, are basically permissible. The shape of these extensions is primarily determined by the way the housing 10 is produced. For example, as in the drawing figure, the extensions 15 can have a rectangular or square cross section. Extensions 15 are arranged with particular preference in the area of the opening of the plug 17 in order to protect, or respectively monitor, the plug contacts in this way. They are also found in the area between the brackets 12. Care should be taken that the extensions 15 are made relatively short. Long extensions would hamper the handling of the housing 10 and could possibly result in injuries. Short pins are sufficient to compensate gravitation energy occurring in case of an impact of the housing prior to installation. In this case the extensions 15 should be designed in such a way, and should be adapted from the viewpoint of the selection of the material so that below a desired energy threshold this impact energy is compensated, without the drop-sensitive components, in particular the sensor(s), being damaged. In special cases, as a function of the specifications, it is sufficient if a visually recognizable deformation or a break of the pin occurs when a predetermined energy threshold has been exceeded. With this, a simple to recognize visual indicator is provided, by means of which it is possible to determine whether the device had possibly already been dropped on the ground and the electronic components could have been damaged.

What is claimed is:

1. A housing for an electrical control device with drop-sensitive components formed as a sensor for triggering protective devices in motor vehicles the housing comprising an exterior housing portion; at least one extension formed on said housing portion; and indicating means for indicating that the housing with the drop sensitive components has already been dropped, said housing portion and said extension being composed of a same, at least plastically deformable material which after having been dropped plastically deforms and thereby forms said indicating means which indicates that the housing with the drop sensitive components has already been dropped.

2. A housing as defined in claim 1, wherein said housing and said at least one extension together form a single-piece component.

3. A housing as defined in claim 1, wherein said at least plastically deformable material is a pressure-cast material.

4. A housing as defined in claim 1, wherein said housing portion has an opening for a plug, said extension being arranged at least in an area of said opening for a plug.

5. A housing as defined in claim 1, wherein said housing portion has fastening brackets, said at least one extension being arranged at least in an area between said fastening brackets.

* * * * *